United States Patent
Amou et al.

(10) Patent No.: US 9,028,970 B2
(45) Date of Patent: May 12, 2015

(54) ADHESIVE COMPOSITION, VARNISH, ADHESIVE FILM AND WIRING FILM

(71) Applicants: Hitachi Cable Fine-Tech, Ltd., Hitachi-shi, Ibaraki (JP); Hitachi Cable, Ltd., Chiyoda-ku, Tokyo (JP)

(72) Inventors: Satoru Amou, Hitachi (JP); Tomiya Abe, Hitachi (JP); Daisuke Shanai, Hitachi (JP); Hiroaki Komatsu, Hitachi (JP); Kenichi Murakami, Hitachi (JP)

(73) Assignee: Hitachi Metals, Ltd., Tokyo (JP)

( * ) Notice: Subject to any disclaimer, the term of this patent is extended or adjusted under 35 U.S.C. 154(b) by 166 days.

(21) Appl. No.: 13/771,949

(22) Filed: Feb. 20, 2013

(65) Prior Publication Data
US 2013/0220674 A1    Aug. 29, 2013

(30) Foreign Application Priority Data
Feb. 23, 2012   (JP) .................................. 2012-037313

(51) Int. Cl.
| | | |
|---|---|---|
| B32B 27/08 | (2006.01) | |
| B32B 27/18 | (2006.01) | |
| B32B 27/26 | (2006.01) | |
| B32B 27/28 | (2006.01) | |
| C09J 163/00 | (2006.01) | |
| C09J 171/10 | (2006.01) | |
| C09J 171/00 | (2006.01) | |
| H05K 1/03 | (2006.01) | |
| C09J 181/06 | (2006.01) | |
| B32B 27/38 | (2006.01) | |
| H05K 3/38 | (2006.01) | |
| B32B 7/12 | (2006.01) | |
| B32B 3/08 | (2006.01) | |

(52) U.S. Cl.
CPC ............. *C09J 171/00* (2013.01); *H05K 1/0313* (2013.01); *C09J 181/06* (2013.01); *B32B 27/38* (2013.01); *C08G 2650/56* (2013.01); *H05K 3/386* (2013.01); *B32B 7/12* (2013.01); *B32B 27/08* (2013.01); *B32B 27/281* (2013.01); *B32B 3/08* (2013.01); *B32B 2307/306* (2013.01); *B32B 2307/7246* (2013.01); *B32B 2307/732* (2013.01); *B32B 2457/08* (2013.01)

(58) Field of Classification Search
None
See application file for complete search history.

(56) References Cited

U.S. PATENT DOCUMENTS

| | | | |
|---|---|---|---|
| 5,290,614 A | 3/1994 | Narushima et al. | |
| 5,298,304 A | 3/1994 | Narushima et al. | |
| 5,523,137 A | 6/1996 | Sei et al. | |
| 5,843,550 A | 12/1998 | Sei et al. | |
| 5,945,188 A | 8/1999 | Sei et al. | |
| 6,777,464 B1 * | 8/2004 | Watanabe et al. .............. 523/457 |
| 2003/0027942 A1 * | 2/2003 | Oota et al. ..................... 525/461 |
| 2003/0078331 A1 | 4/2003 | Kim et al. | |
| 2005/0187311 A1 * | 8/2005 | Nakamura ..................... 522/173 |
| 2011/0206869 A1 | 8/2011 | Nemoto et al. | |
| 2012/0138345 A1 | 6/2012 | Amou et al. | |
| 2013/0161566 A1 * | 6/2013 | Seo et al. ....................... 252/500 |
| 2013/0161838 A1 * | 6/2013 | Han et al. ....................... 257/783 |
| 2014/0158413 A1 * | 6/2014 | Shanai et al. .................. 174/257 |
| 2014/0202737 A1 * | 7/2014 | Shanai et al. .................. 174/251 |

FOREIGN PATENT DOCUMENTS

| | | |
|---|---|---|
| CN | 1392892 A | 1/2003 |
| CN | 102171305 A | 8/2011 |
| JP | 5-29399 A | 2/1993 |
| JP | 2001-262111 A | 9/2001 |
| JP | 2004-136631 A | 5/2004 |
| JP | 2008-258607 A | 10/2008 |
| JP | 2009-67934 A | 4/2009 |
| JP | 2010-143988 A | 7/2010 |
| JP | 2010-150437 A | 7/2010 |
| JP | 2012-116954 A | 6/2012 |

OTHER PUBLICATIONS

Chinese-language Office Action dated Apr. 9, 2014, with English translation (Twenty Four (24) pages).

* cited by examiner

*Primary Examiner* — Michael J Feely
(74) *Attorney, Agent, or Firm* — Crowell & Moring LLP

(57) ABSTRACT

Provided are an adhesive composition with good storage stability, heat resistance, moisture resistance reliability, and adhesion properties; and a curl- and heat-resistant adhesive film and a wiring film using the adhesive composition. The adhesive composition contains 100 parts by weight of a phenoxy resin (A) having plural alcoholic hydroxyl groups in a side chain of the molecule thereof; 2 to 60 parts by weight of a polyfunctional isocyanate compound (B) having an isocyanate group and at least one functional group selected from vinyl, acrylate, and methacrylate groups in the molecule thereof; and 5 to 30 parts by weight of a maleimide compound (C) having plural maleimide groups in the molecule thereof or/and reaction product thereof, in which a total amount of the components (B) and (C) is from 7 to 60 parts by weight.

18 Claims, 7 Drawing Sheets

ADHESIVE COMPOSITION, VARNISH, ADHESIVE FILM AND WIRING FILM

CLAIM OF PRIORITY

The present application claims priority from Japanese Patent application serial No. 2012-037313, filed on Feb. 23, 2012, the content of which is hereby incorporated by reference into this application.

BACKGROUND OF THE INVENTION

1. Field of the Invention

The present invention relates to an adhesive composition having thermosetting properties, and a heat resistant adhesive film which is obtained by using the adhesive composition and does not curl easily, and a wiring film using the adhesive composition.

2. Background of the Invention

In recent years, electronic devices have been decreased in size, thickness, and weight and wiring members used therefor have been required to realize multilayer wirings, fine wirings, and thinning in order to satisfy high-density fine wiring. Further, lead free solder has been used progressively in the relevant field with the aim of decreasing environmental burdens. Under such situations, wiring members such as FFC (flexible flat cable), TAB (tape automated bonding) tape, FPC (flexible printed circuit) and MFJ (multi-frame joiner) are required to have improved heat resistance.

An insulating layer for the above-mentioned wiring members are basically composed of a base film and an adhesive layer. Such a wiring member is described, for example, in Japanese Patent Laid-Open No. Hei 05-29399 (Patent Document 1), in which the base film used therein is, for example, an organic insulating film composed of a heat resistant film such as polyimide, polyether imide, polyphenylene sulfide or polyether ether ketone, or a composite heat resistant film such as epoxy resin-glass cloth or epoxy resin-polyimide-glass cloth. Patent Document 1 discloses use of an adhesive composition containing a polyamide resin and an epoxy resin as the adhesive layer.

However, the adhesive composition described in Patent Document 1 has a problem in storage stability of the heat resistant adhesive film due to high reactivity between the amino group present in the polyamide resin structure and the epoxy resin. For overcoming this problem, Japanese Patent Laid-Open No. 2004-136631 (Patent Document 2) proposes an adhesive composition composed of a phenoxy resin having at both ends thereof an epoxy group, an acrylic rubber, and a curing agent. As the phenoxy resin, a bisphenol A type, a bisphenol F type, a bisphenol AD type, a bisphenol S type, and a copolymerization type having bisphenol A and bisphenol F are exemplified.

Japanese Patent Laid-Open No. 2010-150437 (Patent Document 3) discloses an adhesive composition containing a thermoplastic polyurethane resin having a weight-average molecular weight of from 80,000 to 800,000, an epoxy resin, and an epoxy resin curing agent, in order to overcome the above-mentioned problems.

Since a typical polyurethane resin has high reactivity with an epoxy resin, an adhesive film using it has a problem in storage stability. Patent Document 3 describes that an adhesive film using a polyurethane resin with a molecular weight within a predetermined range has improved storage stability. It has adhesive force of from 1.1 kN/m to 1.7 kN/m.

Japanese Patent Laid-Open No. 2010-143988 (Patent Document 4) discloses that an adhesive composition containing a polyurethane resin, an epoxy resin, and a novolac resin with a specific structure has solder heat resistance of 300° C.

Japanese Patent Laid-Open No. 2001-262111 (Patent Document 5) discloses an adhesive composition containing a (meth)acryl-modified phenoxy resin and an epoxy resin and Japanese Patent Laid-Open No. 2008-258607 (Patent Document 6) discloses an adhesive composition containing a (meth)acryl-modified phenoxy resin, a urethane acrylate oligomer and a silane coupling agent. The epoxy-containing adhesive composition described in Patent Document 5 has excellent heat resistance. The adhesive composition containing a urethane acrylate and a silane coupling agent described in Patent Document 6 has an excellent adhesive force with a metal conductor.

In addition, it is important that the adhesive film using the adhesive composition is resistant to curl as much as possible from the standpoint of the handling properties of the adhesive film.

SUMMARY OF THE INVENTION

In the present invention, there are provided an adhesive composition containing 100 parts by weight of (A) a phenoxy resin having, on the side chain thereof, a plurality of alcoholic hydroxyl groups, from 2 to 60 parts by weight of (B) a polyfunctional isocyanate compound having one isocyanate group in the molecule thereof and at least one functional group selected from the class consisting of a vinyl group, an acrylate group, and a methacrylate group, and from 5 to 30 parts by weight of (C) a maleimide compound having, in the molecule thereof, a plurality of maleimide groups or/and a reaction product of the maleimide compound, with the proviso that a total amount of the components (B) and (C) is from 7 parts by weight to 60 parts by weight, and optionally containing from 1 to 20 parts by weight of (D) an isocyanatosilane compound having in the molecule thereof one or more silanol groups or/and alkoxy groups and one isocyanate group; a heat resistant adhesive film obtained by layering the adhesive composition on a polyimide film; and a wiring film using the heat resistant adhesive film as an insulating layer.

The present invention can provide an adhesive composition excellent in storage stability and adhesion properties and a curl-resistant heat resistant adhesive film obtained using the adhesive composition. Further, the present invention can provide a wiring film having high heat resistance by using the present adhesive film.

DETAILED DESCRIPTION OF THE PREFERRED EMBODIMENTS

Figure 1:
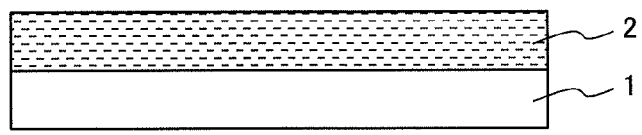
FIG. 1 is a schematic cross-sectional view illustrating a first adhesive film of the present invention.

Although the adhesive composition of Patent Document 2 contains the phenoxy resin known to be relatively excellent in an adhesive force, it has the adhesive force as low as about 0.5 kN/m and has a solder heat resistance of 260° C. which is not sufficient.

It is known that the polyurethane resins used in Patent Documents 3 and 4 usually undergo depolymerization at a temperature of 200° C. or greater. Polyurethane is generally said to be resistant to from 80° C. to 100° C. so that the adhesive composition containing the polyurethane resin cannot be used freely in the field of industrial or automobile electronic devices that requires high heat resistance.

Patent Document 5 has a problem in the adhesive force as low as about 0.6 kN/m.

The adhesive composition in Patent Document 6 lacks attention to the adhesive force with a polyimide film which is a highly heat-resistant base film.

An object of the present invention is to provide an adhesive composition excellent in a storage stability and adhesion properties, and a heat resistant adhesive film which is resistant to curl and also provide a highly heat resistant wiring film by using the adhesive film.

In the present invention, a phenoxy resin having a 5% thermal weight loss temperature exceeding 350° C. was selected as a base resin in developing an adhesive composition excellent in storage stability and also excellent in heat resistance, mechanical reliability, and moisture resistance reliability after adhesion.

Further, a polyimide film excellent in heat resistance was decided to be use as the base material of an adhesive film. In addition, it was necessary to select an appropriate solvent for preparing an adhesive composition by using a phenoxy resin, applying the resulting adhesive composition onto the base film, and then drying to form an adhesive layer.

A good solvent of the phenoxy resin is, for example, tetrahydrofuran (THF) or cyclohexanone. THF facilitating low-temperature drying had a high risk of explosion during the preparation of the adhesive composition. On the other hand, high boiling point solvents such as cyclohexanone requiring high-temperature drying caused problems such as deterioration in the adhesive force and occurrence of the curl since curing of the adhesive composition proceeded at the time of drying.

As a result of various investigations, the present inventors have found that using a mixed solvent of a low boiling point solvent such as methyl ethyl ketone (MEK) and a compound having an isocyanate group in the molecule thereof improves solubility of the phenoxy resin in MEK and thereby allows low-temperature drying, making it possible to suppress the adhesive film from curling.

The improvement in solubility of the phenoxy resin is presumed to be realized by a change in polarity of the phenoxy resin itself due to a reaction between the hydroxyl group present on the side chain thereof with the isocyanate compound and a change in the polarity of the solvent caused by the addition of the isocyanate compound.

Examples of the compound having one isocyanate group in the molecule thereof include butyl isocyanate, hexyl isocyanate, octadecyl isocyanate, cyclohexyl isocyanate, phenyl isocyanate, methacryl isocyanate, 4-methylbenzyl isocyanate, vinyl isocyanate, 2-acryloyloxyethyl isocyanate, 2-methacryloyloxyethyl isocyanate, 1,1-bis(acroyloxymethyl)ethyl isocyanate, and 3-isocyanatopropyl trimethoxysilane. Using a polyfunctional isocyanate compound which has a vinyl group, an acrylate group, a methacrylate group, or an alkoxysilyl group having reactivity different from that of the isocyanate group is preferred from the standpoint of obtaining the adhesive composition with improved heat resistance.

Moreover, the present inventors have studied various kinds of crosslinking agents from the standpoint of the adhesion properties between the adhesive composition and the polyimide film. As a result, it has been found that a maleimide compound having a plurality of maleimide groups in the structure thereof is particularly suitable for a crosslinking agent showing high adhesion properties, leading to the completion of the present invention.

The following are examples of the mode for carrying out the present invention.

(1) An adhesive composition contains 100 parts by weight of a phenoxy resin (A) having a plurality of alcoholic hydroxyl groups on a side chain thereof, from 2 to 60 parts by weight of a polyfunctional isocyanate compound (B) having at least one isocyanate group and at least one functional group selected from the class consisting of a vinyl group, an acrylate group and a methacrylate group in the molecule thereof, and from 5 to 30 parts by weight of a maleimide compound (C) having a plurality of maleimide groups in the structure thereof or/and a reaction product thereof, in which a total amount of the components (B) and (C) is from 7 to 60 parts by weight.

The adhesive composition according to the present invention can be dried at low temperatures because of high solubility of it in general-purpose low boiling point solvents so that an adhesive film obtained using it can be suppressed from curling. In addition, the resulting adhesive composition is suitable for an adhesive film satisfying both high heat resistance and high adhesive strength due to a curing reaction between the maleimide compound and the phenoxy resin.

(2) The adhesive composition further contains from 1 to 20 parts by weight of an isocyanatosilane compound (D) having one or more silanol groups or/and alkoxy groups and one isocyanate group in the molecule thereof.

The isocyanatosilane compound binds to the phenoxy resin via a urethane bond during preparation or drying of an adhesive varnish to introduce a silanol group or/and an alkoxysilane group into the phenoxy resin structure. This increases adhesive force between the adhesive film and a conductor wiring.

(3) Further, the adhesive composition may contain from 0.001 to 0.1 part by weigh of a urethanation catalyst (E), from 0.0002 part by weight to 1 part by weight of a radical polymerization inhibitor (F), or from 0.03 to 1 part by weight of a radical polymerization initiator (G) having a 1-hour half life temperature of from 120° C. to 180° C.

The urethanation catalyst accelerates formation of a urethane bond between the isocyanate compound and the phenoxy resin. The radical polymerization inhibitor has a function of suppressing progress of an unnecessary crosslink reaction during preparation of the adhesive composition, storage of the adhesive varnish, or storage of the adhesive film. The radical polymerization initiator accelerates the curing reaction of the adhesive film after adhesion to provide a wiring film having improved adhesive force and heat resistance as a final product.

(4) The phenoxy resin has preferably a styrene-equivalent weight average molecular weight of from 40000 to 100000. This makes it possible to keep the mechanical strength of the adhesive layer and thereby keep or improve the adhesive force of the adhesive layer.

(5) The phenoxy resin has preferably a bisphenol S skeleton, particularly preferably has a structure of the following Formula (1).

range of from 25 μm to 100 μm from the standpoints of productivity and handling properties of the adhesive film or wiring film.

(7) In order to form a preferable adhesive layer, the above-mentioned adhesive film has enhanced adhesive force by adding from 1 part by weight to 20 parts by weight of the isocyanatosilane compound (D) to the above-mentioned adhesive composition.

(8) The above-mentioned adhesive composition may contain an urethanation catalyst (E), a radical polymerization inhibitor (F), and a radical polymerization initiator (G) having a 1-hour half life temperature of from 120° C. to 180° C. in addition to the component (D). They can accelerate formation of a urethane bond, suppress progress of an unnecessary crosslink reaction during storage of an adhesive varnish, and accelerate the curing reaction of the adhesive layer after adhesion, thereby improving the adhesive force and heat resistance of a wiring film which is a final product. These components (D) to (G) are added in an amount equal to that described above.

(9) An adhesive film having high adhesive force can be obtained by using a phenoxy resin having a styrene-equivalent weight average molecular weight of from 40000 to 100000. In addition, a cured adhesive layer has an increased glass transition temperature by using a phenoxy resin having a bisphenol S skeleton as described above.

(10) According to the present invention, a laminated film having a conductor layer can be obtained by fusion bonding of the above-mentioned adhesive film and a conductor foil.

Figure 3:
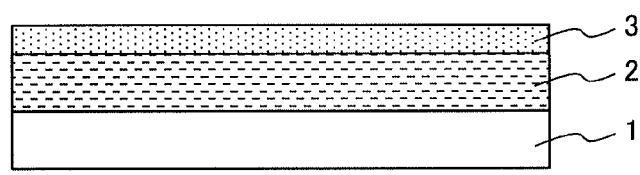
FIG. 3 is a schematic cross-sectional view illustrating a first laminated film of the present invention formed using the adhesive film shown in FIG. 1.
Figure 4:
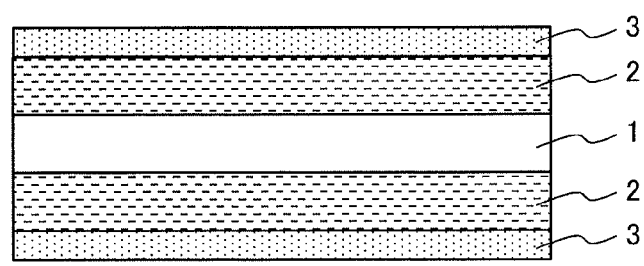
FIG. 4 is a schematic cross-sectional view illustrating a second laminated film of the present invention formed using the adhesive film shown in FIG. 2.

The respective amounts of the components (A) to (C) are equal to the above-described ones. In the laminated film of the present invention, a conductor layer 3 can be formed on either the one side or both sides of the adhesive film as shown in FIG. 3 or FIG. 4. Although the thickness of each layer in the Formula (1)

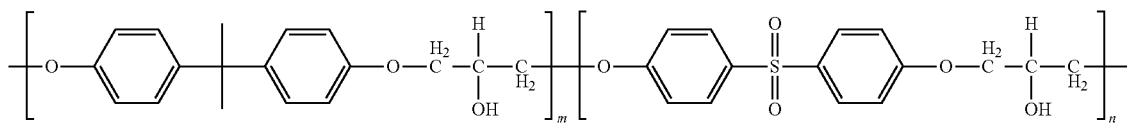

The phenoxy resin has preferably a bisphenol A skeleton and a bisphenol S skeleton. In the above-mentioned structural formula, m and n each stand for an integer and an n/m molar ratio falls preferably within a range of from 3/7 to 5/5. Using the phenoxy resin having this structure makes it possible to provide an adhesive composition having high glass transition temperature without impairing the high adhesive force of the cured adhesive composition.

(6) The present invention provides an adhesive film having the adhesive composition disposed on a polyimide base material.

Figure 2:
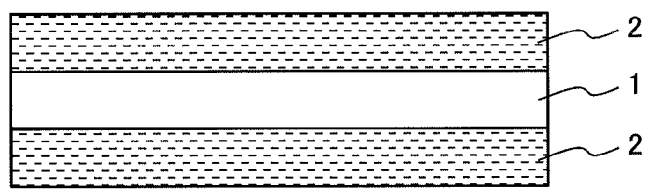
FIG. 2 is a schematic cross-sectional view illustrating a second adhesive film of the present invention.

The adhesive film of the present invention can be provided as a one-side heat resistant adhesive film having an adhesive layer 2 on one side of a polyimide base material 1 as shown in FIG. 1 and a both-side heat resistant adhesive film having the adhesive layer 2 on both sides of the polyimide base material 1 as shown in FIG. 2.

The thickness of the adhesive layer 2 and the polyimide base material 1 can be selected freely, depending on the intended use, but it is preferred to roughly select the thickness of the adhesive layer within a range of from 10 μm to 100 μm and the thickness of the polyimide base material within a laminated film may be adjusted freely, it is preferred to adjust the thickness of the conductor layer before processing to fall within a range of from 9 μm to 35 μm in order to keep wiring processing accuracy by etching.

(11) The adhesive composition containing an isocyanatosilane compound has improved adhesive force between the conductor layer and the adhesive layer.

(12) According to the present invention, a wiring film is provided by subjecting the conductor layer on the laminated film to wiring processing.

The adhesive layer of the wiring film is preferably in B-stage form, more preferably cured by post curing or the like. This makes it possible to enhance the adhesive force between the adhesive layer and the conductor layer.

Figure 5:
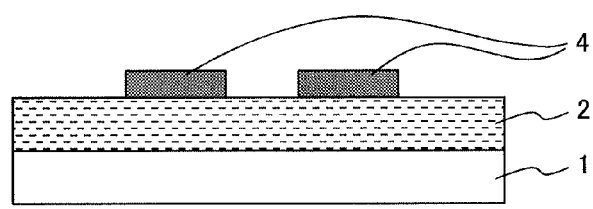
FIG. 5 is a schematic cross-sectional view illustrating a first wiring film of the present invention.
Figure 6:
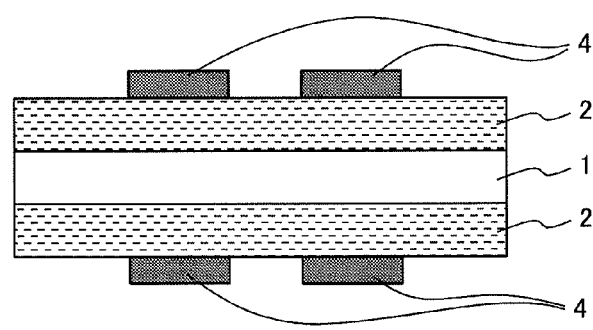
FIG. 6 is a schematic cross-sectional view illustrating a second wiring film of the present invention.

With regard to the wiring film of the present invention, a conductor wiring 4 can be formed on one side or both sides of the wiring film as shown in FIG. 5 or 6 by etching the laminated film shown in FIG. 3 or 4, respectively.

Figure 7:
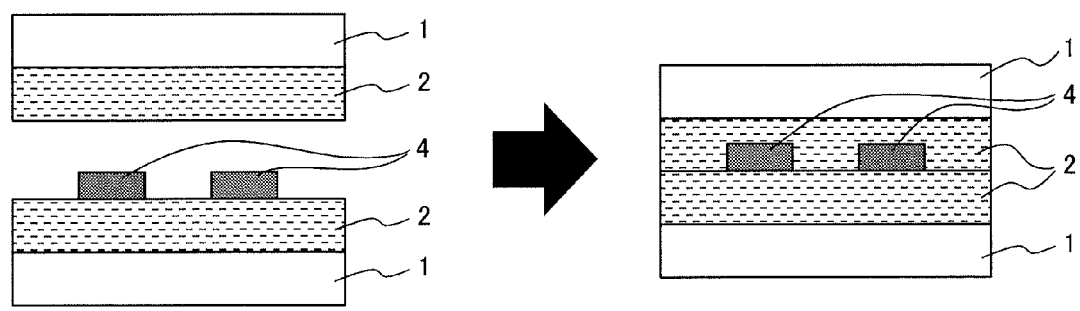
FIG. 7 is an explanatory view showing a method for forming a third wiring film of the present invention from the adhesive film shown in FIG. 1 and the wiring film shown in FIG. 5.
Figure 8:
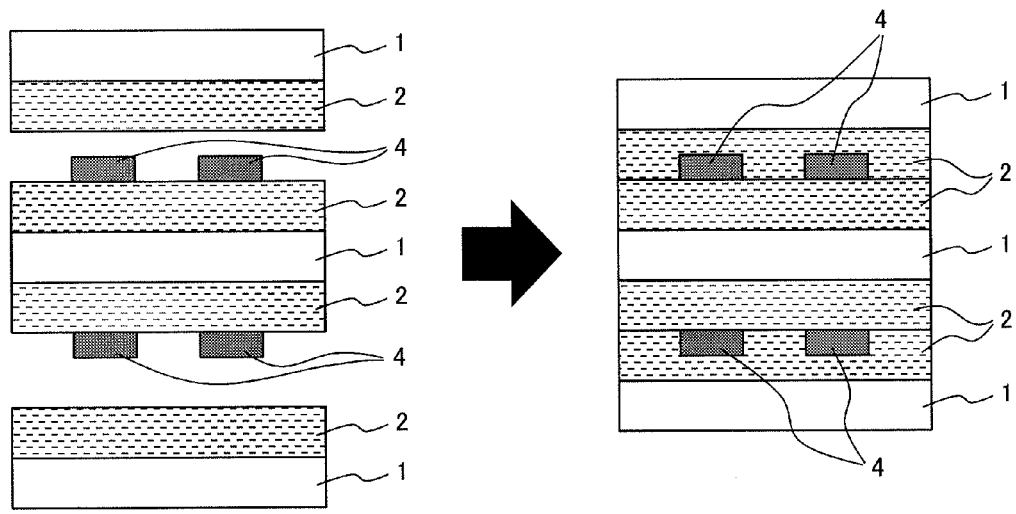
FIG. 8 is an explanatory view showing a method for forming a fourth wiring film of the present invention from the adhesive films shown in FIG. 1 and the wiring film shown in FIG. 6.
Figure 9:
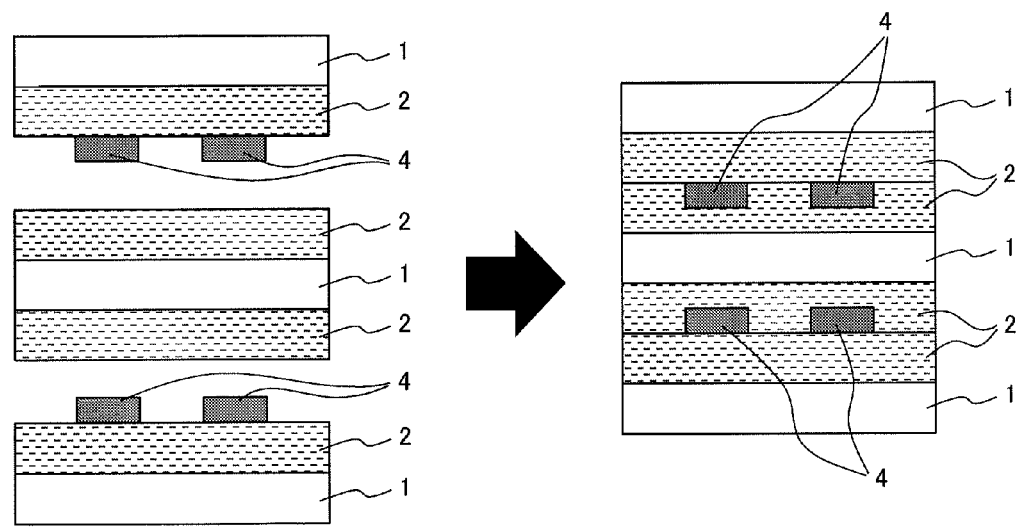
FIG. 9 is an explanatory view showing a method for forming a fifth wiring film of the present invention from the adhesive film shown in FIG. 2 and the wiring films shown in FIG. 5.

As shown in FIGS. 7 to 9, the wiring on the outer layer can be coated with the adhesive film of the present invention. The conductor wiring can be protected by it. Further, the present invention can provide a multilayer wiring film by placing a plurality of wiring films between the adhesive films as shown in FIG. 10.

The wiring film shown in FIGS. 7 to 10 includes the adhesive films; and the conductor wiring disposed therebetween, in which the respective adhesive layers of the adhesive films are bonded to each other.

Figure 10:
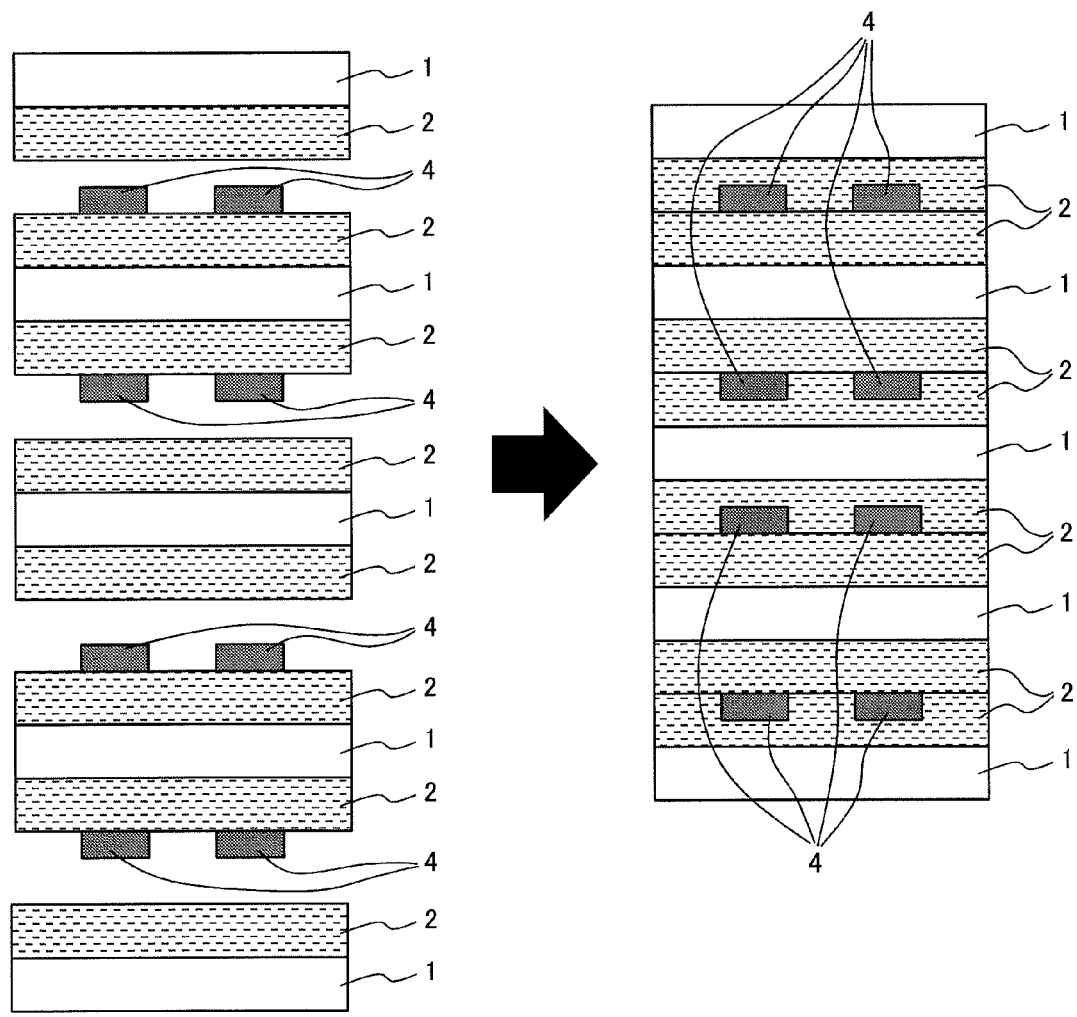
FIG. 10 is an explanatory view showing a method for forming a sixth wiring film of the present invention from the adhesive films shown in FIG. 1, the adhesive film shown in FIG. 2, and the wiring films shown in FIG. 6.

The wiring film shown in FIGS. 8 to 10 includes the adhesive films; and conductor wirings disposed therebetween, in which the conductor wirings are disposed between the adhesive layers, the adhesive film having the adhesive layers on both sides of the polyimide film has the conductor wirings on the both sides, and the adhesive film having the adhesive layers on one side of the polyimide film has the conductor wiring on the one side.

Figure 11:
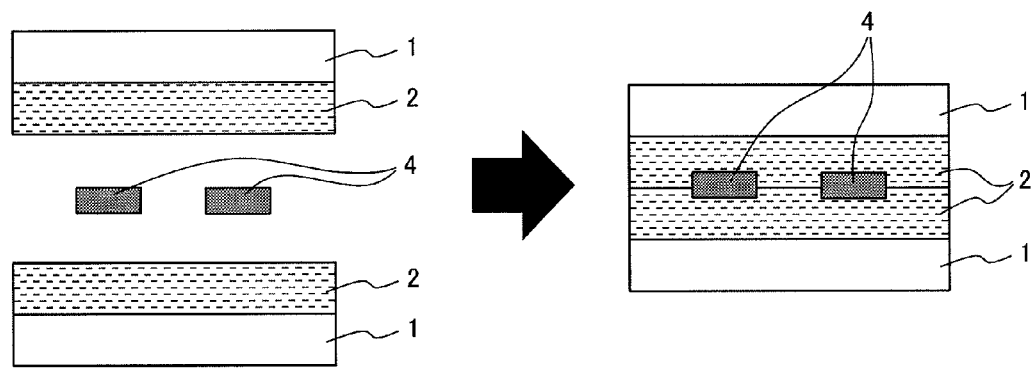
FIG. 11 is an explanatory view showing a method for forming a seventh wiring film of the present invention from the adhesive films shown in FIG. 1 and conductor wirings.

According to the present invention, a wiring film can also be formed by overlapping two one-side adhesive films and the conductor wiring 4 as shown in FIG. 11 and fusion bonding them.

Moreover, a multilayer wiring film can be formed by overlapping two one-side adhesive films, a both-side adhesive film, and a conductor wiring 4 and fusion bonding them.

Figure 12:
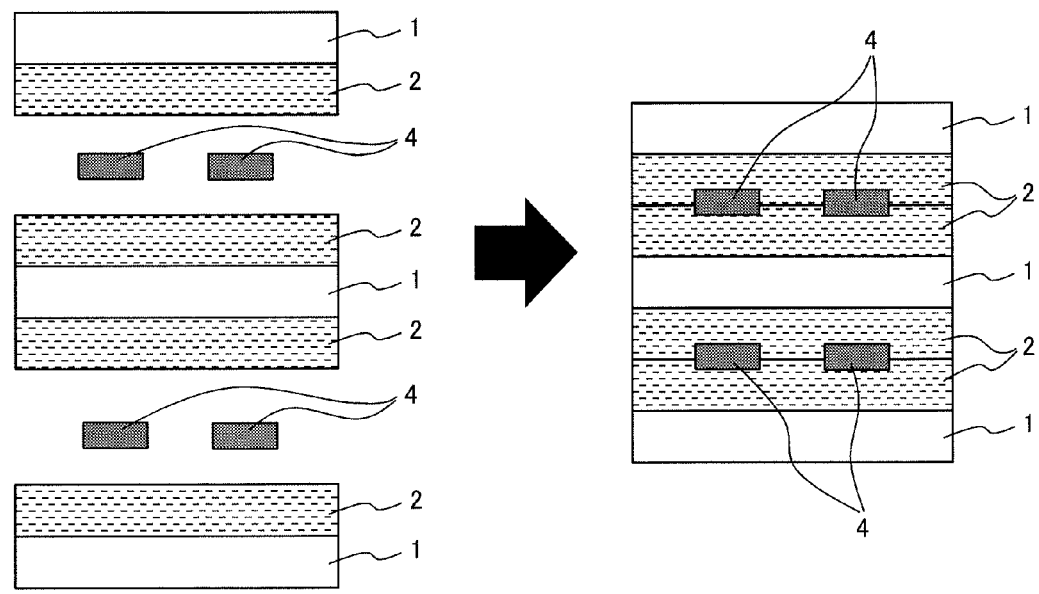
FIG. 12 is a schematic cross-sectional view showing a method for forming an eighth wiring film of the present invention from the adhesive films shown in FIG. 1, the adhesive film shown in FIG. 2, and conductor wirings.

In the wiring film shown in FIG. 11 or FIG. 12, using a conductor wire 4 having a thickness of from 35 μm to 100 μm is preferred in order to ensure handling properties of the conductor wiring 4 when it is provided on the adhesive film. The present wiring film can be formed at high productivity because it does not require etching process of the wiring.

(13) The wiring film has preferably a plurality of wirings in the same plane. This can increase the wiring density.

(14) To obtain the above-mentioned wiring film having enhanced adhesive force between the conductor wiring and the heat resistant adhesive film, the adhesive layer is post-heated at a temperature of the fusion bonding temperature thereof or greater. In the present invention, the fusion bonding temperature is preferably 160° C. or less and fusion bonding pressure is preferably 3 MPa or less, more preferably 1 MPa or less from the standpoint of productivity. The post-curing temperature is preferably from 180° C. to 220° C. Post curing may be conducted while applying a pressure to the wiring film or without applying a pressure.

(15) In the above-mentioned wiring film, the conductor wiring is preferably a copper wiring from the standpoint of high conductivity.

(16) In the above-mentioned wiring film, oxidation of the copper wiring is suppressed and the adhesion properties are improved by coating at least a portion of the outer layer of the copper wiring with a metal layer containing any of tin, nickel, zinc or cobalt, or/and an oxide layer or/and a hydroxide layer of the metal.

(17) Moreover, in the above-mentioned wiring film, at least a portion of the outer layer of the conductor wiring may be coated with a silane coupling agent containing at least one functional group selected from the class consisting of a vinyl group, a styryl group, an acrylate group and a methacrylate group. The adhesion reliability between the conductor wiring and the adhesive layer can be improved by this coating.

Next, the main function of each of the phenoxy resin, polyfunctional isocyanate compound, maleimide compound, isocyanatosilane compound, urethanation catalyst, radical polymerization inhibitor, and radical polymerization initiator in the present invention will next be described.

The phenoxy resin is a component mainly having a function of providing the adhesive composition with a film forming property and providing the adhesive layer with flexibility and mechanical strength after curing. As a preferred range of the molecular weight for developing such a function, a weight average molecular weight as measured by gel permeation chromatography (GPC) (a polystyrene standard) is from 20000 to 100000. From the standpoints of the adhesive force and mechanical force of the cured product, it is preferably from 40000 to 100000. Examples of a bisphenol A phenoxy resin include "YP-55U", "YP-50", and "YP-50S" (trade name; product of Toto Kasei).

The content of the bisphenol S skeleton based on the total amount of the bisphenol S skeleton and other skeleton constituents, for example, a bisphenol A skeleton is preferably from 30 mol % to 50 mol %. Examples of such a phenoxy resin include "YX8100" (trade name; product of Japan Epoxy Resin) and "YPS-007A30" (trade name; product of Toto Kasei).

The polyfunctional isocyanate compound is a component which reacts with a hydroxyl group on the side chain of the phenoxy group to enhance the solubility of the phenoxy resin in a general-purpose solvent and at the same time, imparts the phenoxy resin with radical polymerizability, that is, crosslinkability. Examples of such a compound include vinyl isocyanate which is a product of Sigma Aldrich Japan and "Karenz (trade mark) MOI" (2-methacryloyloxyethyl isocyanate), "Karenz (trade mark) AOI" (2-acryloyloxyethyl isocyanate), and "Karenz (trade mark) BEI" (1,1-bis(acryloxymethyl)ethyl isocyanate), each product of Showa Denko.

The isocyanatosilane compound reacts with the hydroxyl group on the side chain of the phenoxy resin to enhance the solubility of the phenoxy resin in a general-purpose solvent. At the same time, it introduces a silanol group or/and an alkoxysilane group into the side chain of the phenoxy resin to cause crosslinking between alkoxysilane groups or/and silanol groups to improve heat resistance. In addition, it contributes to improvement in the adhesive force with the conductor wiring due to the chemical bonding with a metal, metal oxide or metal hydroxide on the conductor wiring. Examples of such a chemical compound include 3-(triethoxysilyl)propyl isocyanate.

The maleimide compound having a plurality of maleimide groups in the structure thereof is a component which reacts with the hydroxyl group in the phenoxy resin and an unsaturated double bond-containing group introduced in the phenoxy resin to impart the system with curability and adhesion properties. By adding this maleimide compound, the cured adhesive layer has improved heat resistance, moisture resistance reliability, adhesion properties, and chemical resistance.

Specific preferred examples of the maleimide compound include "BMI-1000", "BMI-2000", "BMI-5000", "BMI-5100", and "BMI-TMH" (each, trade name; product of Daiwa Kasei Industry). "BMI-TMH" is particularly preferred because it has a melting temperature as low as from 80° C. to 100° C.

In the present invention, the polyfunctional isocyanate compound is added in an amount of from 2 parts by weight to 60 parts by weight, and the maleimide compound is added in an amount of from 5 parts by weight to 30 parts by weight, each based on 100 parts by weight of the phenoxy resin; and a total amount of the polyfunctional isocyanate compound and the maleimide compound falls within a range of from 7 parts by weight to 60 parts by weight. Amounts of the polyfunctional isocyanate compound less than 2 parts by weight may deteriorate the solubility of the phenoxy resin, leading to preparation of a non-uniform varnish, while amounts exceeding 60 parts by weight may lead to preparation of an adhesive composition having deteriorated adhesive force. Amounts of the maleimide compound less than 5 parts by weight may deteriorate the heat resistance, while those exceeding 30 parts by weight tend to deteriorate the adhesive force.

With regard to the amount of another component, the urethanation catalyst is added in an amount of from 0.001 part by weight to 0.1 part by weight; the radical polymerization inhibitor is added in an amount of from 0.0002 part by weight to 1 part by weight; and the radical polymerization initiator is added in an amount of from 0.03 part by weight to 1 part by weight, each based on 100 parts by weight of the phenoxy resin.

The solvent for preparing a varnish from the adhesive composition of the present invention is preferably methyl ethyl ketone, ethyl acetate, or the like which is a general-purpose solvent having a boiling point not greater than 100° C.

By controlling as described above, the solubility of the phenoxy resin in the general-purpose solvent increases, making it possible to prepare an adhesive varnish which can be dried at low temperatures. The adhesive film formed from this adhesive varnish does not curl easily and has good handling properties and the wiring film which is a final product is equipped with heat resistance, moisture resistance reliability, and high adhesion properties.

The urethanation catalyst has a function of accelerating an urethanation reaction between the phenoxy resin and the isocyanate compound. Specific examples of it include metal salts such as dibutyl tin dilaurate and tertiary amines such as triethylamine and N,N-dimethylcyclohexylamine.

The radical polymerization inhibitor has a function of suppressing an unnecessary radical polymerization reaction during preparation of an adhesive composition, storage of an adhesive varnish, or storage of an adhesive film. It also functions as an antioxidant of the adhesive layer and also contributes to improvement in the thermal stability of the wiring film. Examples include phenols such as t-butylhydroquinone, 2,6-t-butyl-4-methylphenol, 2,6-di-t-butyl-4-methylphenol, and t-butyl pyrocatechol.

The radical polymerization initiator has a function of accelerating the crosslink reaction among the maleimide compound, the polyfunctional isocyanate compound, and a reaction product between the polyfunctional isocyanate compound and the phenoxy resin. Various organic peroxides having a 1-hour half life temperature of from 120° C. to 80° C. are preferred. Specific examples include "Perhexa C", "Perhexa V", and "Perhexin 25B", each product of NOF can be used.

As the base material of the heat resistant adhesive film in the present invention, a polyimide film is preferably used from the standpoint of heat resistance. Although no particular limitation is imposed on the thickness of the polyimide film, it preferably falls within a range of from 25 μm to 100 μm from the standpoints of handling properties and film cost.

The polyimide film has preferably breaking extension at 25° C. of 75% or greater. Using of a polyimide film with high flexibility as the base film can enhance the adhesive force between the adhesive composition and the base film without modifying the surface of the base film and at the same time, can suppress the rupture of the adhesive film, making it possible to obtain a wiring film, which is a final product, having increased adhesion reliability. Examples of such a polyimide film include "Kapton (trade mark) 100V", "Kapton 200V", "Kapton 100H", and "Kapton 200H" (each, trade name; product of DuPont Toray), and "Apical (trade name) 25NPI" (product of Kaneka Corp.).

The thickness of the adhesive layer formed on the base material is preferably from 10 μm to 100 μM from the standpoints of the productivity and handling properties of the adhesive film and the wiring film. By forming a wiring film while selecting the thickness of the adhesive layer from the above-described range according to the thickness of the conductor wiring, a satisfactory wiring burying property can be achieved. In the method of forming (method as shown in FIGS. 7 to 9) a conductor wiring without etching processing, when the thickness of the conductor is from 35 μm to 100 μm, it is preferred to form an adhesive layer with the thickness of from 10 μm to 100 μm in consideration of the wiring burying property.

In the wiring film of the present invention, the adhesive force between the conductor wiring and the heat resistant adhesive film can be enhanced by post-heating at the fusion bonding temperature or greater. The post-heating is conducted preferably under the following conditions: for from 30 minutes to 60 minutes at from 180° C. to 220° C. In the present invention, as the conductor wiring, a copper wiring coated with a metal layer containing any of tin, nickel, zinc and cobalt, or/and an oxide or hydroxide layer of the metal is preferred. This can suppress oxidation of the copper surface and thereby ensure stable adhesion properties. A layer of a metal different therefrom on the copper surface can be formed by plating.

Further, on the outermost surface of the conductor wiring of the present invention, a vinyl-based silane coupling agent containing any of a vinyl group, a styryl group, an acrylate group, and a methacrylate group can be disposed. Since these silane coupling agents form a primary bond with the vinyl group, acrylate group, or methacrylate group introduced into the phenoxy resin or the maleimide compound, they contribute to the improvement of the adhesion properties, heat resistance, and moisture resistance reliability of the wiring film.

Specific examples of the silane coupling agent include commercially available silane coupling agents such as vinyltrimethoxysilane, vinyltriethoxysilane, 3-methacryloxypropylmethyldimethoxysilane, 3-methacryloxypropyltrimethoxysilane, 3-acryloxypropyltrimethoxysilane, and p-styryltrimethoxysilane.

The surface treatment with the silane coupling agent is conducted by applying a 0.5 wt % to 8 wt % solution of the silane coupling agent in water or an organic solvent to a conductor wiring and then drying the resulting conductor wiring at a temperature of from 100° C. to 150° C. for from 10 minutes to 30 minutes.

Figure 13:
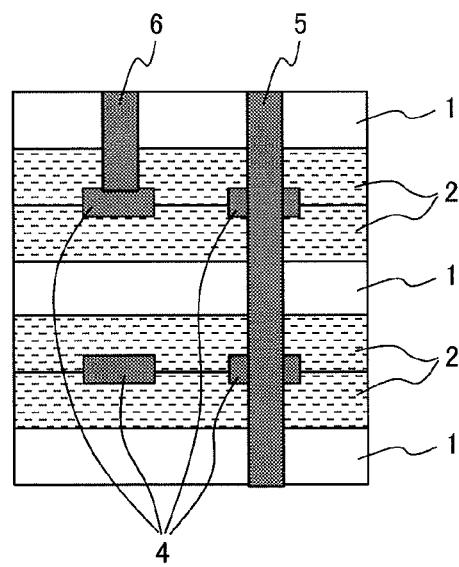
FIG. 13 is a schematic cross-sectional view illustrating an interlayer connection of the wiring films of the present invention.
Figure 14:
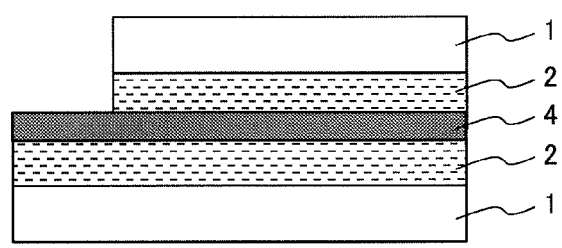
FIG. 14 is a schematic cross-sectional view illustrating a ninth wiring film of the present invention, from the end portion of which a conductor wiring is lead out.
Figure 15:
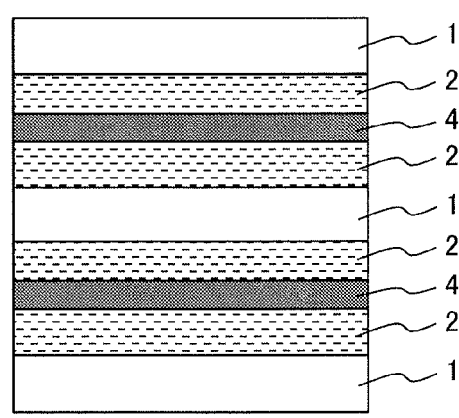
FIG. 15 is a schematic cross-sectional view illustrating a tenth wiring film of the present invention.

In the wiring film of the present invention, a through-hole (5) or blind via hole (6) technique to be used for a multilayer printed board may be used to form interlayer connection and leading-out of the conductor wiring as shown in FIG. 13. The wiring can also be lead out from the end of the wiring film as shown in FIG. 14 or 15.

EXAMPLES

The present invention will hereinafter be described in detail by Examples and Comparative Examples.

The following are tested samples and evaluation methods employed.

(1) Tested Samples

"BMI-1000": trade name of 4,4'-biphenylmethane bismaleimide, product of Daiwa Kasei Kogyo, and melting temperature: from 147° C. to 168° C.

"BMI-5100": trade name of 3,3'-dimethyl-5,5'-diethyl-4,4'-diphenylmethane bismaleimide, product of Daiwa Kasei Kogyo, and melting temperature: from 130° C. to 156° C.

"BMI-TMH": trade name of 1,6-bismaleimido-(2,2,4-trimethyl)hexane, product of Daiwa Kasei Kogyo, and melting temperature: from 80° C. to 100° C.

Trifunctional acrylate monomer: "M3031", trade name of trimethylolpropane ethoxytriacrylate, and product of Toyo Chemicals.

Triallyl isocyanate: "TAIL", product of Tokyo Chemical Industry.

Bisphenol A epoxy resin: "jER828" trade name, product of Mitsubishi Chemical, and epoxy equivalent: 190 g/eq.

Bisphenol A phenoxy resin: "YP-50" trade name, product of Toto Kasei, and styrene-equivalent weight average molecular weight: 73000.

Bisphenol A/bisphenol F copolymer type phenoxy resin: "YP-70" trade name, product of Toto Kasei, and styrene-equivalent weight average molecular weight: 55000.

Phenoxy resin having a bisphenol S skeleton: "YPS-007A30" trade name, product of Toto Kasei, and styrene-equivalent weight average molecular weight: 49000. It is used after reprecipitating from methanol, drying at 160° C. for 4 hours, and removing cyclohexanone, a solvent. The n/m molar ratio of "YPS-007A30" is 3/7.

Polyfunctional isocyanate A: "Karenz (trade mark) MOI" (2-methacryloyloxyethyl isocyanate), product of Showa Denko.

Polyfunctional isocyanate B: "Karenz (trade mark) AOI" (2-acryloyloxyethyl isocyanate), product of Showa Denko.

Polyfunctional isocyanate C: vinyl isocyanate, product of Sigma Aldrich Japan.

Isocyanatosilane: 3-(triethoxysilyl)propyl isocyanate, product of Tokyo Chemical Industry.

Urethanation catalyst: DBTDL: dibutyl tin dilaurate, product of Wako Pure Chemical Industries.

Radical polymerization inhibitor: BMP, 2,6-t-butyl-4-methylphenol, product of Wako Pure Chemical Industries.

Radial polymerization initiator: "Perhexa V" (trade name) product of NOF, 1-hour half life temperature: 126° C.

Epoxy curing catalyst: "CP-66", trade name of 2-butenyltetramethylenesulfonium hexafluoroantimonate, product of Adeka.

Cyclohexanone: product of Wako Pure Chemical Industries and boiling point: 155.7° C.

Methyl ethyl ketone: MEK, product of Wako Pure Chemicals and boiling point: 79.5° C.

Polyimide film 1: "Kapton (trade mark) 100V", product of DuPont Toray Co, breaking extension: 82%, and thickness: 25 μm.

Polyimide film 2: "Kapton (trade mark) 200H", product of DuPont Toray Co, breaking extension: 80%, and thickness: 50 μm.

Polyimide film 3: "Apical (trade mark) NPI", product of Kaneka Corporation, breaking extension: 75%, and thickness: 25 μm.

Polyimide film 4: "Apical (trade mark) AH", product of Kaneka Corporation, breaking extension: 110%, and thickness: 25 μm.

Polyimide film 5: "Kapton (trade mark) 200EN", product of DuPont Toray Co, breaking extension: 60%, and thickness: 50 μm.

Polyimide film 6: "UPILEX (trade mark) 25S", breaking extension: 42%, and thickness: 25 μm.

Copper foil: a copper foil of 100 μm thick having, on the surface thereof, a 500-nm thick Ni plated layer.

The surface of the copper foil was subjected to methacrylsilane treatment. Silane treatment conditions: A Ni-plated copper foil was washed with UV light and dipped in a 1% aqueous solution of 3-methacryloxypropyltrimethoxysilane for 3 minutes. The foil was then taken out and dried at 110° C. for 30 minutes to provide a methacrylsilane layer on the surface.

(2) Preparation of Adhesive Composition

Components were mixed at a predetermined mixing ratio. MEK or cyclohexanone was added to the resulting mixture, followed by stirring at 25° C. for 6 hours to prepare an adhesive composition. Regarding the solubility of vanish, the adhesive composition from which the phenoxy resin had not been precipitated after preparation was evaluated "o" (good). On the other hand, the adhesive composition from which the phenoxy resin had been precipitated after preparation was evaluated "x" (bad).

(3) Formation of Adhesive Film

An adhesive film was formed by applying the adhesive composition onto a polyimide base material by using a bar coater having a predetermined gap, followed and drying at 160° C. for 30 minutes or at 80° C. for 30 minutes. The thickness of the adhesive layer was adjusted to 30 μm.

(4) Preparation of Resin Plate and Measurement of Glass Transition Temperature

The adhesive composition was applied onto a sheet made of polytetrafluoroethylene (PTFE) and the resulting sheet was dried at 160° C. for 30 minutes. The dried adhesive layer was separated from the PTFE sheet to obtain about 5 g of the adhesive film.

A 30 mm×80 mm×1 mm spacer made of PTFE was filled with the resulting adhesive film, followed by press molding under the conditions of 3 MPa and 180° C./60 minutes under vacuum via a 0.1-mm thick PTFE sheet and a mirror sheet to prepare a resin plate. About 5 mg of a sample was cut out from the resulting resin plate. Differential Scanning calorimeter (DSC) of the sample was observed under the conditions of a heating rate of 10° C./min in a nitrogen gas stream to determine its glass transition temperature.

(5) Evaluation of Curl of Adhesive Film

Figure 16A:
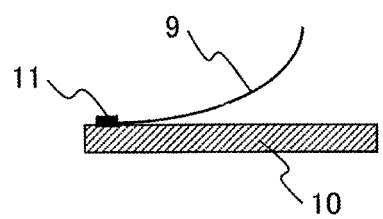
FIG. 16A is a schematic view showing an evaluation method of the curl of the adhesive film of the present invention.
Figure 16B:
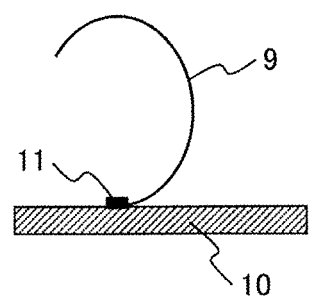
FIG. 16B is a schematic view showing an adhesive film which has curled strongly.

The adhesive film was cut into a 2.5 cm×5 cm piece and the presence or absence of a curl was evaluated visually. The evaluation method is shown in FIGS. 16A and 16B. The following are details of it.

The adhesive film was cut into a 2.5 cm×5 cm piece and as shown in FIGS. 16A and 16B, one of the short sides was fixed to a glass substrate 10 with a double-coated tape 11. The width of the fixed portion was set at 1 mm. An average height (mm), from the glass substrate, between both edges of the sample which had warped was observed as the index of a curl. The curl of the sample shown in FIG. 16A was small and it was evaluated "o" (good). The sample which had curled strongly as shown in FIG. 16B (the free end of the adhesive film 9 exceeded the vertical line on the double-coated tape 11) was evaluated "x" (bad).

(6) Evaluation of Adhesive Force

A copper foil was placed on the surface of the adhesive film on the side of the adhesive layer and they were adhered by heating and applying pressure for 10 minutes under the conditions of 160° C. and 1 MPa. The resulting film was then post-heated at 180° C. for 60 minutes without applying pressure. The resulting sample film was cut into a 1-cm wide piece. A 180° peel test was performed between the copper foil and the adhesive film. The terms "initial adhesive force" and "adhesive force after treatment at constant temperature and humidity" as used herein mean adhesive force between a copper foil and a polyimide film, more precisely, adhesive force between an interface between the copper foil and the adhesive composition and an interface between the polyimide film and the adhesive composition. One of the characteristics of the adhesive composition of the present invention is that adhesion between a polyimide base material 1, that is, the base material of the adhesive film (FIG. 1) and the adhesive layer 2 is high in addition to that the above-mentioned adhesive force is high.

Adhesion between the adhesive composition of the present invention and the polyimide base material was evaluated based on the adhesion to "Kapton 100V", a low thermal shrinkage type film.

The following are physical properties of "Kapton 100V" (according to the product guide of Kapton (polyimide film) <Kapton>; Du Pont-Toray, 2011 Sep. 5)
(i) Coefficient of thermal expansion (measuring method: from 50° C. to 200° C. at a heating rate of 10° C./min) (50-200° C.): 27 ppm/° C.
(ii) Specific heat (differential calorimeter) 1.1 Jg-1·° C.
(iii) Thermal conductivity (measured using Model TC 1000, Comparing method) 0.16 W·m·° C.
(iv) Heat life (measuring method: oven with internal air circulation; time until tensile elongation shows 1% deterioration)
   (250° C.) 8 years
   (275° C.) 1 year
   (300° C.) 3 months
   (400° C.) 12 hours
(v) Thermal shrinkage (measuring method: according to IPC-TM-650 No. 22) 0.05%

The adhesive composition of the present invention shows excellent adhesion to various polyimide base materials. As a typical example, the initial value with Kapton 100V is 1 kN/m or greater, which is one of the important characteristics of the adhesive composition.

(7) Solder Heat-Resistance Test

A copper foil was placed on the surface of the film on the side of the adhesive layer and they were adhered by heating and applying pressure for 10 minutes under the conditions of 160° C. and 1 MPa. The resulting film was then post-heated at 180° C. for 60 minutes in the air without pressure. The sample thus obtained was floated in a soldering bath of 280° C. and kept for one hour. As a result of visual inspection, samples with no swelling were evaluated "o" (good) and samples with swelling were evaluated "x" (bad).

(8) Evaluation of Moisture Resistance Reliability

A sample film for evaluating adhesive force was left to stand for 1000 hours under a constant temperature and humidity environment of 85° C. and 90%. The sample was then subjected to 180° peel test.

Comparative Examples 1 to 3

Comparative Examples 1 to 3 are examples of an adhesive composition using cyclohexanone as a solvent. The compositional ratio and evaluation results of each of the adhesive compositions are shown in Tables 1 and 2. These adhesive compositions required high temperature drying when adhesive films were formed therefrom so that the adhesive films curled strongly. The adhesive films with a strong curl are not preferred because they are inferior in handling properties and deteriorate the productivity of a wiring film. In addition, the adhesive compositions had a problem in adhesive force and solder heat resistance.

Comparative Examples 4 to 6

Comparative Examples 4 to 6 are examples of an adhesive composition using MEK as a solvent. A uniform varnish was not obtained because of low solubility of various phenoxy resins in MEK.

Examples 1 to 3

Examples 1 to 3 are examples using a mixed solvent of MEK and an isocyanate compound. Addition of a small amount of the isocyanate compound improved the solubility of the phenoxy resin in MEK. This made it possible to reduce the drying temperature upon formation of an adhesive film to 80° C. and realize a curl-resistant adhesive film. Moreover, irrespective of the kind of the phenoxy resin, adhesion samples composed of the adhesive film and a copper foil were found to have high solder heat resistance and were observed to have high adhesive force before and after the treatment under constant temperature and humidity conditions.

These findings have revealed that the adhesive compositions or adhesive films according to the present invention do not curl easily and are excellent in handling properties, heat resistance, and moisture resistance and that wiring films using them have high reliabilities (solder heat resistance, adhesion reliability, and moisture resistance reliability).

The term "adhesive force" as used herein means adhesive force between a copper foil and a polyimide film, more precisely, adhesive force between the interface of the copper foil and the adhesive composition and the interface of the polyimide film and the adhesive composition.

Table 1 shows the resin compositional ratio of the adhesive composition and the solvent. In this table, unit of numerical values is "part by weight".

In addition, Table 2 shows each evaluation result described above.

TABLE 1

|  |  |  | Comp. Ex. 1 | Comp. Ex. 2 | Comp. Ex. 3 | Comp. Ex. 4 | Comp. Ex. 5 | Comp. Ex. 6 | Ex. 1 | Ex. 2 | Ex. 3 |
| --- | --- | --- | --- | --- | --- | --- | --- | --- | --- | --- | --- |
| Phenoxy resin | YP-50 | Bisphenol A | 100 | 0 | 0 | 100 | 0 | 0 | 100 | 0 | 0 |
|  | YP-70 | Bisphenol A/F | 0 | 100 | 0 | 0 | 100 | 0 | 0 | 100 | 0 |
|  | YPS-007A30 | Bisphenol A/S | 0 | 0 | 100 | 0 | 0 | 100 | 0 | 0 | 100 |
| Polyfunctional isocyanate | Karenz MOI | Methacryl isocyanate | 0 | 0 | 0 | 0 | 0 | 0 | 5 | 5 | 5 |
| Urethanation catalyst | DBTDL | 1 wt % MEK solution | 0 | 0 | 0 | 0 | 0 | 0 | 0.3 | 0.3 | 0.3 |
| Polymerization inhibitor | BMP | 1 wt % MEK solution | 0 | 0 | 0 | 0 | 0 | 0 | 0.2 | 0.2 | 0.2 |
| Crosslinking agent | BMI-1000 | Bismaleimide | 17.6 | 17.6 | 17.6 | 17.6 | 17.6 | 17.6 | 17.6 | 17.6 | 17.6 |
| Solvent | Cyclohexanone | Boiling point ≅ 156° C. | 500 | 500 | 500 | 0 | 0 | 0 | 0 | 0 | 0 |
|  | MEK | Boiling point ≅ 80° C. | 0 | 0 | 0 | 500 | 500 | 500 | 500 | 500 | 500 |

TABLE 2

|  | Comp. Ex. 1 | Comp. Ex. 2 | Comp. Ex. 3 | Comp. Ex. 4 | Comp. Ex. 5 | Comp. Ex. 6 | Ex. 1 | Ex. 2 | Ex. 3 |
|---|---|---|---|---|---|---|---|---|---|
| Solubility of varnish | ○ | ○ | ○ | x | x | x | ○ | ○ | ○ |
| Drying conditions | | 160° C./30 min | | — | | | | 80° C./30 min | |
| Curl of adhesive film | x | x | x | | | | ○ | ○ | ○ |
| Initial adhesive force (kN/m) | 0.1 | 0.2 | 0.6 | | | | 1.4 | 1.5 | 1.3 |
| Solder heat resistance | x | x | x | | | | ○ | ○ | ○ |
| Glass transition temperature (° C.) | 75 | 70 | 125 | | — | | 75 | 70 | 125 |
| Adhesive force (kN/m) after treatment under constant temperature and humidity conditions | | — | | | — | | 0.9 | 1.1 | 0.8 |

Examples 4 to 9

Examples 4 to 9 are examples obtained by varying the kind or amount of the isocyanate compound. The compositional ratio and evaluation results of each of the adhesive compositions are shown in Tables 3 and 4. In any system, the solubility of the phenoxy resin in MEK was improved. This enabled to reduce the drying temperature upon formation of an adhesive film to 80° C. and realized a curl-resistant adhesive film. Moreover, adhesion samples composed of any of the adhesive films and a copper foil were found to have high solder heat resistance and were observed to have high adhesive force before and after treatment under constant temperature and humidity conditions.

These findings have revealed that the adhesive compositions or adhesive films according to the present invention are excellent in handling properties, heat resistance, and moisture resistance and wiring films using them have high reliabilities (solder heat resistance, adhesion reliability, mechanical reliability, and moisture resistance reliability).

Comparative Examples 7 to 9

Comparative Examples 7 to 9 are examples obtained while varying the kind of the crosslinking agent. The compositional ratio and evaluation results of each of the adhesive compositions are shown in Tables 5 and 6. Adhesive compositions using an acrylic monomer, an allyl monomer, or an epoxy resin had a high glass transition temperature but had markedly deteriorated adhesive force. As a result of observation of the peeled interface of the adhesive films, peeling occurred at the interface between the polyimide film and the adhesive layer. This has suggested that the crosslinking agent used in these comparative examples has a problem in deterioration of the adhesive force with the polyimide film.

Comparative Example 10

Comparative Example 10 is an example obtained using a maleimide compound serving as a crosslinking agent and a polyfunctional isocyanate compound in a total amount exceeding 60 parts by weight based on 100 parts by weight of the phenoxy resin. The compositional ratio and evaluation results of the adhesive composition are shown in Tables 5 and 6. The present systems were superior in adhesive force to those of Comparative Examples 7 to 9, but the adhesive force was not sufficient.

Examples 10 and 11

Examples 10 and 11 are examples containing isocyanatosilane. The compositional ratio and the evaluation results of each of the adhesive compositions are shown in Tables 5 and 6. Although the glass transition temperature showed a slight decrease, high adhesive force due to the effect of isocyanatosilane was confirmed.

TABLE 3

|  |  |  | Ex. 4 | Ex. 5 | Ex. 6 | Ex. 7 | Ex. 8 | Ex. 9 |
|---|---|---|---|---|---|---|---|---|
| Phenoxy resin | YP-50 | Bisphenol A | 100 | 100 | 100 | 100 | 100 | 100 |
| Polyfunctional isocyanate | Karenz MOI | Methacryl isocyanate | 5.5 | 13.6 | 27.2 | 41 | 0 | 0 |
|  | Karenz AOI | Acryl isocyanate | 0 | 0 | 0 | 0 | 13.6 | 0 |
|  | — | Vinyl isocyanate | 0 | 0 | 0 | 0 | 0 | 13.6 |
| Urethanation catalyst | DBTDL | 1 wt % MEK solution | 0.3 | 0.8 | 1.6 | 2.6 | 0.8 | 0.8 |
| Polymerization inhibitor | BMP | 1 wt % MEK solution | 0.2 | 0.4 | 0.8 | 1.2 | 0.4 | 0.4 |
| Crosslinking agent | BMI-1000 | Bismaleimide | 17.6 | 17.6 | 17.6 | 17.6 | 17.6 | 17.6 |
| Solvent | MEK | Boiling point ≅ 80° C. | 400 | 400 | 400 | 400 | 400 | 400 |

TABLE 4

|  | Ex. 4 | Ex. 5 | Ex. 6 | Ex. 7 | Ex. 8 | Ex. 9 |
|---|---|---|---|---|---|---|
| Solubility of varnish | ○ | ○ | ○ | ○ | ○ | ○ |
| Drying conditions | | | 80° C./30 min | | | |
| Curl of adhesive film | ○ | ○ | ○ | ○ | ○ | ○ |
| Initial adhesive force (kN/m) | 1.7 | 1.7 | 1.2 | 1.2 | 1.7 | 1.7 |
| Solder heat resistance | ○ | ○ | ○ | ○ | ○ | ○ |
| Glass transition temperature (° C.) | 75 | 75 | 75 | 75 | 75 | 75 |
| Adhesive force (kN/m) after treatment under constant temperature and humidity conditions | 1.5 | 1.6 | 0.9 | 0.9 | 1.6 | 1.6 |

TABLE 5

| | | | Comp. Ex. 7 | Comp. Ex. 8 | Comp. Ex. 9 | Comp. Ex. 10 | Ex. 10 | Ex. 11 |
|---|---|---|---|---|---|---|---|---|
| Phenoxy resin | YP-50 | Bisphenol A | 100 | 100 | 100 | 100 | 100 | 100 |
| Vinyl isocyanate | Karenz MOI | Methacryl isocyanate | 41 | 41 | 41 | 41 | 27.2 | 27.2 |
| Isocyanatosilane | — | — | 0 | 0 | 0 | 0 | 10 | 20 |
| Urethanation catalyst | DBTDL | 1 wt % MEK solution | 3.3 | 3.3 | 3.3 | 3.3 | 3.3 | 3.3 |
| Polymerization inhibitor | BMP | 1 wt % MEK solution | 2.5 | 2.5 | 2.5 | 2.5 | 2.5 | 2.5 |
| Crosslinking agent | M3031 | Acrylate monomer | 20 | 0 | 0 | 0 | 0 | 0 |
| | TAIC | Allyl monomer | 0 | 20 | 0 | 0 | 0 | 0 |
| | jER828 | Bisphenol A type epoxy | 0 | 0 | 20 | 0 | 0 | 0 |
| | BMI-TMH | Bismaleimide | 0 | 0 | 0 | 20 | 20 | 20 |
| Epoxy curing catalyst | CP-66 | Thermal acid generator | 0 | 0 | 1.2 | 0 | 0 | 0 |
| Radical polymerization initiator | Perhexa V | Peroxide | 0.7 | 0.7 | 0.7 | 0.7 | 0.7 | 0.7 |
| Solvent | | MEK | 500 | 500 | 500 | 500 | 500 | 500 |

TABLE 6

| | Comp. Ex. 7 | Comp. Ex. 8 | Comp. Ex. 9 | Comp. Ex. 10 | Ex. 10 | Ex. 11 |
|---|---|---|---|---|---|---|
| Solubility of varnish | ○ | ○ | ○ | ○ | ○ | ○ |
| Drying conditions | | | 80° C./30 min | | | |
| Curl of adhesive film | ○ | ○ | ○ | ○ | ○ | ○ |
| Initial adhesive force (kN/m) | 0 | 0 | 0.2 | 0.4 | 1.3 | 1.4 |
| Glass transition temperature (° C.) | >220 | >220 | 180 | >220 | 115 | 115 |

Examples 12 and 13

Examples 12 and 13 are examples obtained by varying the mixing amount of the maleimide compound. The compositional ratio and evaluation results of each of the adhesive compositions are shown in Tables 7 and 8. In any system, the solubility of the phenoxy resin in MEK was improved. This enables to reduce the drying temperature upon formation of an adhesive film to 80° C. and realized a curl-resistant adhesive film. In any adhesive film, adhesion samples with a copper foil were found to have high solder heat resistance and were observed to have high adhesive force before and after the treatment under constant temperature and humidity conditions. These findings have revealed that the adhesive compositions or adhesive films according to the present invention are excellent in handling properties, heat resistance, and moisture resistance and wiring films using them have high reliabilities (solder heat resistance, adhesion reliability, and moisture resistance reliability).

TABLE 7

| | | | Example 12 | Example 13 |
|---|---|---|---|---|
| Phenoxy resin | YP-50 | Bisphenol A | 100 | 100 |
| Polyfunctional isocyanate | Karenz MOI | Methacryl isocyanate | 13.6 | 13.6 |
| Urethanation catalyst | DBTDL | 1 wt % MEK solution | 0.8 | 0.8 |
| Polymerization inhibitor | BMP | 1 wt % MEK solution | 0.4 | 0.4 |
| Crosslinking agent | BMI-500 | Bismaleimide | 5 | 30 |
| Solvent | MEK | Boiling point ≅ 80° C. | 400 | 400 |

TABLE 8

| | Example 12 | Example 13 |
|---|---|---|
| Solubility of varnish | ○ | ○ |
| Drying conditions | 80° C./30 min | |
| Curl of adhesive film | ○ | ○ |
| Initial adhesive force (kN/m) | 1.3 | 1.2 |
| Solder heat resistance | ○ | ○ |
| Glass transition temperature (° C.) | 75 | 75 |
| Adhesive force (kN/m) after treatment under constant temperature and humidity conditions | 1.0 | 0.8 |

Comparative Examples 11 and 12

Comparative Examples 11 and 12 are examples of adhesive films obtained using, as a base film, polyimide films having a breaking extension at 25° C. of 60% and 42%, respectively. The compositional ratio of each of the adhesive compositions is shown in Table 9, while evaluation results of the adhesive force are shown in Table 10. The adhesive force with a copper foil tended to decrease with a reduction in the extension of the base film. In the case of Comparative Examples 11 and 12, the compositional ratio of each of the adhesive compositions fell within a range of the compositional ratio of the adhesive compositions of the present invention, but the breaking extension of the base film was less than 75% so that the initial adhesive force was less than 1 kN/m. The destruction of the adhesive force evaluation samples occurred as peeling at the interface between the adhesive layer of the adhesive film and the base film.

These findings have revealed that adhesive films using a polyimide film having a breaking extension at 25° C. of 60% or less as a base material need some measures to increase the adhesive force between the adhesive layer and the base film.

As described above, conditions necessary for the adhesive compositions, adhesive films, and wiring films have been specified, respectively, in the present invention. Even if the composition of an adhesive composition falls within a range of the present invention, when the adhesive composition is used as an adhesive of an adhesive film and another condition does not satisfy the condition of the present invention, it is not suitable for an adhesive film. This will similarly apply to a wiring film.

Examples 14 to 17

Examples 14 to 17 are examples of an adhesive film using a polyimide film having a breaking extension at 25° C. of from 75% to 110% as a base film. The compositional ratio of each of the adhesive compositions is described in Table 9, while the evaluation results of the adhesive force are described in Table 10.

The adhesive force with a copper foil was 1.4 kN/m or greater in any of these examples. The destruction of each of the adhesive force evaluation samples occurred as breaking of the adhesive film. Therefore, particularly high adhesive force was observed in Example 16 using a thick polyimide film. These findings have revealed that the adhesive film using a polyimide film having a breaking extension at 25° C. of 75% or greater as a base film has high adhesive force and a wiring film using it has high reliability (adhesion reliability).

by electroplating. After washing, it was dipped in a 1% aqueous solution of 3-methacryloxypropyltrimethoxysilane for 3 minutes and then, it was taken out. The resulting copper wire was dried at 110° C. for 30 minutes to form a methacrylsilane layer on the surface thereof to prepare a copper wiring.

(2) The adhesive film was cut into a 10 cm×2 cm piece and ten rectangular copper wires (each 300 μm wide and 35 μm thick) were placed at 1 mm intervals on the surface of the adhesive layer of the resulting piece.

(3) Another adhesive film cut into a 9 cm×2 cm piece was prepared and it was placed on the copper wirings while aligning the long-axis direction thereof with that of the above-mentioned adhesive film and bringing the surface of the adhesive layer into contact with the copper wirings.

(4) The laminate thus obtained was then put between polyethylene terephthalate films subjected to releasing treatment and pressed under the conditions of 160° C., 10 minutes, and 1 MPa to bond the above-mentioned two adhesive films with the copper wirings therebetween.

The laminate was taken out from the polyethylene terephthalate film and post-heated at 180° C. for 60 minutes to form a pseudo wiring film having an electrode at the end portion thereof. The sample thus obtained had a good wiring burying property and caused neither cracking nor peeling even after the constant temperature and humidity test or solder heat resistance test. Thus, the wiring film showed desirable results as a heat-resistant wiring film.

The heat resistant adhesive film of the present invention is suitable for an insulation adhesive sheet, for example, TAB tape, FPC, FFC and MFJ. In addition, the wiring member of

TABLE 9

|  |  |  | Comp. Ex. 11 | Comp. Ex. 12 | Ex. 14 | Ex. 15 | Ex. 16 | Ex. 17 |
|---|---|---|---|---|---|---|---|---|
| Phenoxy resin | YP-50 | Bisphenol A |  |  |  | 100 |  |  |
| Polyfunctional isocyanate | Karenz MOI | Methacryl isocyanate |  |  |  | 5 |  |  |
| Urethanation catalyst | DBTDL | 1 wt % MEK solution |  |  |  | 0.3 |  |  |
| Polymerization inhibitor | BMP | 1 wt % MEK solution |  |  |  | 0.2 |  |  |
| Crosslinking agent | BMI-2000 | Bismaleimide |  |  |  | 17.6 |  |  |
| Solvent | MEK | Boiling point ≅ 80° C. |  |  |  | 500 |  |  |

TABLE 10

|  | Comp. Ex. 11 | Comp. Ex. 12 | Ex. 14 | Ex. 15 | Ex. 16 | Ex. 17 |
|---|---|---|---|---|---|---|
| Breaking extension (%) of polyimide film | 60 | 42 | 110 | 82 | 80 | 75 |
| Thickness of polyimide film (μm) | 50 | 25 | 25 | 25 | 50 | 25 |
| Initial adhesive force (kN/m) | 0.7 | 0.3 | 1.5 | 1.4 | 2.0 | 1.4 |

Example 18

A pseudo wiring film was formed by using the adhesive film of Example 5. The steps are shown below.

(1) A rectangular copper wire having a width of 300 μm and a thickness of 35 μm was plated with Ni of about 0.5 μm thick the present invention has excellent heat resistance so that it is suitable for a wiring member of automobiles and electronic and electric apparatuses.

What is claimed is:

1. An adhesive composition comprising:

100 parts by weight of a phenoxy resin (A) having a plurality of alcoholic hydroxyl groups on the side chain thereof;

2 to 60 parts by weight of a polyfunctional isocyanate compound (B) having one isocyanate group and at least one functional group of a vinyl group, an acrylate group and a methacrylate group in the molecule thereof;

5 to 30 parts by weight of a maleimide compound (C) having a plurality of maleimide groups in the molecule thereof or/and a reaction product thereof, 0.001 to 0.1 part by weight of an urethanation catalyst (E),
0.0002 to 1 part by weight of a radical polymerization inhibitor (F), and
0.03 to 1 part by weight of a radical polymerization initiator (G) which has a 1-hour half life temperature of from 120° C. to 180° C.,
wherein a total amount of the component (B) and the component (C) is from 7 to 60 parts by weight.

2. The adhesive composition according to claim 1, further comprising:
1 to 20 parts by weight of an isocyanatosilane compound (D) having one or more silanol groups or/and alkoxy groups and one isocyanate group in the molecule thereof.

3. The adhesive composition according to claim 1, wherein the phenoxy resin has a styrene-equivalent weight average molecular weight of from 40000 to 100000.

4. The adhesive composition according to claim 1, wherein the phenoxy resin is a bisphenol S skeleton-containing phenoxy resin represented by the following Formula (1):

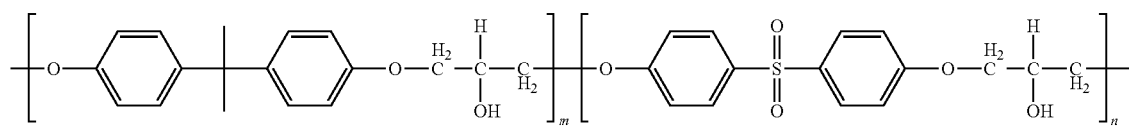

Formula (1)

where m and n each stand for an integer.

5. The adhesive composition according to claim 4, wherein the phenoxy resin has an n/m molar ratio of from 3/7 to 5/5.

6. An adhesive varnish comprising:
the adhesive composition as claimed in claim 1; and methyl ethyl ketone or ethyl acetate.

7. An adhesive film comprising:
a polyimide base material; and
the thermosetting adhesive composition as claimed in claim 1 as an adhesive layer on one side or both sides of the polyimide base material,
wherein the polyimide base material has a breaking extension percentage at 25° C. of from 75% to 110%.

8. The adhesive film according to claim 7, wherein the adhesive layer has a thickness of from 10 μm to 100 μm and the polyimide base material has a thickness of from 25 μm to 100 μm.

9. A laminated film comprising:
the adhesive film as claimed in claim 7; and
a conductor layer disposed on the adhesive layer of the adhesive film.

10. The laminated film according to claim 9, wherein the conductor layer has a thickness of from 9 μm to 35 μm.

11. A wiring film comprising:
a first adhesive film as claimed in claim 7 having the adhesive layer on one side of the polyimide film;
a second adhesive film as claimed in claim 7 having the adhesive layer on one side of the polyimide film, the second adhesive film being located such that the adhesive layers of the first and second adhesive films face each other; and
a conductor wiring sandwiched between the adhesive layers of the first and second adhesive films,
wherein the adhesive layers of the first and second adhesive films are bonded to each other.

12. The wiring film according to claim 11, wherein the conductor wiring has a thickness of from 35 μm to 100 μm.

13. The wiring film according to claim 11, wherein a plurality of the conductor wirings are disposed in the same plane.

14. The wiring film according to claim 11, wherein the adhesive layer is post-heated at the fusion bonding temperature of the adhesive layer or greater.

15. The wiring film according to claim 11, wherein the conductor wirings are copper wirings.

16. The wiring film according to claim 15, wherein at least a portion of an outer layer of the copper wirings is coated with at least one layer selected from the group consisting of a metal layer, a metal oxide layer, and a metal hydroxide layer, which includes at least one element selected from the group consisting of tin, nickel, zinc and cobalt.

17. The wiring film according to claim 11, wherein the conductor wirings are copper wirings and at least a portion of an outer layer of the conductor wirings is coated with a silane coupling agent containing any of an amino group, a vinyl group, a styryl group, an acrylate group, and a methacrylate group.

18. A wiring film comprising:
a first adhesive film as claimed in claim 7 having the adhesive layer on both sides of the polyimide film;
a second adhesive film as claimed in claim 7 having the adhesive layer on one side of the polyimide film, the second adhesive film being located such that the adhesive layer of the second adhesive film and one adhesive layer of the first adhesive film face each other;
a third adhesive film as claimed in claim 7 having the adhesive layer on one side of the polyimide film, the third adhesive film being located such that the adhesive layer of the third adhesive film and the other adhesive layer of the first adhesive film face each other; and
conductor wirings sandwiched between the adhesive layers of the first and second and the first and third adhesive films;
wherein the adhesive layers of the first and second and the first and third adhesive films are bonded to each other.

* * * * *